(12) United States Patent
Nakada et al.

(10) Patent No.: US 8,377,256 B2
(45) Date of Patent: Feb. 19, 2013

(54) STRIPPING DEVICE AND STRIPPING METHOD

(75) Inventors: Kimihiro Nakada, Kawasaki (JP);
Yasumasa Iwata, Kawasaki (JP);
Akihiko Nakamura, Kawasaki (JP);
Yoshihiro Inao, Kawasaki (JP); Satoshi Kobari, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/613,384

(22) Filed: Sep. 13, 2012

(65) Prior Publication Data

US 2013/0000852 A1    Jan. 3, 2013

Related U.S. Application Data

(62) Division of application No. 13/093,412, filed on Apr. 25, 2011, now Pat. No. 8,302,651.

(30) Foreign Application Priority Data

Apr. 27, 2010  (JP) ................................ 2010-102066
Apr. 27, 2010  (JP) ................................ 2010-102081

(51) Int. Cl.
*B32B 38/10*    (2006.01)
(52) U.S. Cl. .................... 156/703; 156/705; 156/754
(58) Field of Classification Search .................. None
See application file for complete search history.

(56) References Cited

U.S. PATENT DOCUMENTS

| 5,718,984 | A | * | 2/1998 | Iwase et al. ............... 429/49 |
| 6,435,249 | B1 | | 8/2002 | Komine et al. |
| 6,492,195 | B2 | | 12/2002 | Nakanishi et al. |
| 7,211,168 | B2 | | 5/2007 | Miyanari |
| 2001/0005043 | A1 | | 6/2001 | Nakanishi et al. |
| 2010/0024853 | A1 | | 2/2010 | Nakamura et al. |

FOREIGN PATENT DOCUMENTS

| JP | 2001-185519 A | 7/2001 |
| JP | 2008-177412 A | 7/2008 |

OTHER PUBLICATIONS

Office Action issued in parent U.S. Appl. No. 13/093,412 on Mar. 9, 2012.

* cited by examiner

*Primary Examiner* — Mark A Osele
*Assistant Examiner* — Nickolas Harm
(74) *Attorney, Agent, or Firm* — Knobbe Martens Olson & Bear LLP

(57) ABSTRACT

A stripping method for stripping a support plate from a laminate including a substrate and the support plate adhered to the wafer via an adhesive layer, in which the adhesive layer is formed from an adhesive compound soluble in a non-polar solvent or a highly polar solvent; and the stripping method includes supplying the non-polar solvent or the highly polar solvent, so that the non-polar solvent or the highly polar solvent is retained at least on an edge portion of that surface of the laminate which faces the support plate, and on a lateral surface of the laminate.

3 Claims, 7 Drawing Sheets

STRIPPING DEVICE AND STRIPPING METHOD

RELATED APPLICATIONS

This application is a divisional of U.S. patent application Ser. No. 13/093,412, filed Apr. 25, 2011, which claims priority under 35 U.S.C. §119(a)-(d) to Japanese Patent Applications Numbers 2010-102066 and 2010-102081, both filed on Apr. 27, 2010, the entire contents of which are incorporated herein by reference.

TECHNICAL FIELD

The present invention relates to a stripping device and a stripping method for stripping a supporting plate from a substrate to which the supporting plate is adhered.

BACKGROUND OF THE INVENTION

As devices such as mobile phone, digital AV apparatuses, IC cards etc. have been improved to have higher performance, semiconductor silicon chips (hereinafter, refer to as chips) to be mounted on the devices have to be smaller and thinner in order to greatly increase a number of chips mounted in packages of the devices. To greatly increase a number of chips mounted in the package, the chips should have a thin thickness in a range of 25 to 150 μm.

However, semiconductor wafers (hereinafter, refer to as wafers) to be substrates of the chips is weakened in strength when the wafers are polished to a thin thickness. The thin wafers with weak strength are easy to be cracked or curved. Moreover, the thin wafers with weak strength are difficult to transport by automatic transportation. This requires manual transportation, and thereby tedious handling.

To deal with this problem, a wafer support system has been developed to reinforce the strength of the wafers by adhering a plate (called a supporting plate, and generally made from glass or rigid plastic) to the wafers before polishing. The wafer support system prevents cracking and curving of the wafer. The wafer support system, which reinforces the strength of the wafers, allows automatic transportation of the thin semiconductor wafers.

The wafers and supports are adhered with each other via an adhesive tape, thermoplastic resin, an adhesive, or the like. After a wafer adhered with the supporting plate is thinned, the wafer is stripped off from the supporting plate before dicing. For example, in case where the wafer and the supporting plate are adhered with each other via an adhesive, the adhesive is dissolved so as to strip the wafer off from the supporting plate.

Patent Literature 1 discloses one example of such a technique of stripping a support plate from a wafer. In the technique of Patent Literature 1, the dissolving an adhesive layer for adhering a wafer and a support plate having holes is carried out by soaking into a solvent the support plate having holes, so as to deliver the solvent to the adhesive layer via the holes. Patent literature 1 also discloses that the dissolving the adhesive agent adhering the wafer and the support plate is carried out by supplying the solvent onto a surface of the support plate and vibrating the solvent so as to facilitate the dissolving the adhesive agent with the solvent. Moreover, Patent Literature 2 discloses that a solvent is supplied onto a support plate having holes and the solvent is delivered to the adhesive layer via the holes.

CITATION LIST

Patent Literatures
Patent Literature 1
Japanese Patent Application Publication, Tokukai, No. 2001-185519 (Publication Date 2001, July 6)
Patent Literature 1
Japanese Patent Application Publication, Tokukai, No. 2008-177412 (Publication Date 2008, July 31)

SUMMARY OF THE INVENTION

Technical Problem

The conventional art as disclosed in Patent Literature 1 requires use of a jig at a wafer edge portion of the wafer in order to prevent a dicing tape (adhered on the wafer) or the like from being contaminated with the solvent, so that the jig presents the leakage of the solvent. The presence of the jig lowers solubility of the adhesive layer, especially, at the wafer edge section. Moreover, in the techniques as disclosed in Patent Literatures 1 and 2, the solvent is supplied to the adhesive layer via the holes of the support plate. Therefore, the solubility of the adhesive layer is lower especially at an edge portion of the support plate in which no hole is formed, than the other parts of the support plate. As a result, the stripping of the support plate from the wafer is time-consuming.

If the adhesive still remains partially on the wafer, the stripping of the wafer off from the support plate should be carried out after the adhesive still remained partially on the wafer is dissolved. In the techniques as disclosed in Patent Literatures 1 and 2, the solvent is supplied to the adhesive layer via the holes of the support plate. Therefore, the solubility of the adhesive layer is lower especially at an edge portion of the support plate in which no hole is formed, than the other parts of the support plate. Moreover, the technique disclosed in Patent Literature 2 has such a problem that the vibration is transmitted unevenly, thereby causing incomplete dissolving. If the adhesive agent can be dissolved more evenly, it will lead to such an advantage that it is possible to strip the support plate from the wafer in a shorter time.

The present invention was accomplished in view of the aforementioned problem and an object of the present invention is to provide a stripping method and a stripping device capable of striping a support plate from the wafer in a shorter time.

Solution to Problem

In order to attain the object, a first stripping method according to the present invention is a stripping method for stripping a support plate from a laminate including a substrate and the support plate adhered to the wafer via an adhesive layer, wherein: the adhesive layer is formed from an adhesive compound soluble in a non-polar solvent or an adhesive compound soluble in a highly polar solvent; and the stripping method comprises the step of supplying the non-polar solvent or the highly polar solvent, so that the non-polar solvent or the highly polar solvent is retained at least on an edge portion of that surface of the laminate which surface faces the support plate, and on a lateral surface of the laminate.

Moreover, a first stripping device according to the present invention is a stripping device for stripping a support plate from a laminate including a substrate and the support plate adhered to the wafer via an adhesive layer, wherein: the adhesive layer is formed from an adhesive compound soluble in a non-polar solvent or an adhesive compound soluble in a highly polar solvent; and the stripping device comprises retaining means for containing the laminate inside thereof in which the non-polar solvent or the highly polar solvent is retained.

Moreover, a second stripping device according to the present invention is a stripping device for stripping a support plate from a laminate including a substrate and the support plate adhered to the substrate via an adhesive layer, the stripping device comprising: retaining means for retaining on the laminate a solvent for dissolving the adhesive layer; at least one vibrating section for generating vibration to vibrate at least the solvent; and moving means for moving the at least one vibrating section relatively to the laminate.

Moreover, a second stripping method according to the present invention is a stripping method for stripping a support plate from a laminate including a substrate and the support plate adhered to the substrate via an adhesive layer, the stripping method comprising the steps of: supplying on the laminate a solvent for dissolving the adhesive layer, so that the solvent is retained on the laminate; vibrating, by a vibrating section, at least the solvent retained on the laminate; and moving the vibrating section relatively to the laminate.

Advantageous Effects of the Invention

The first stripping method according to the present invention is a stripping method for stripping a support plate from a laminate including a substrate and the support plate adhered to the wafer via an adhesive layer, wherein: the adhesive layer is formed from an adhesive compound soluble in a non-polar solvent or an adhesive compound soluble in a highly polar solvent; and the stripping method comprises the step of supplying the non-polar solvent or the highly polar solvent, so that the non-polar solvent or the highly polar solvent is retained at least on an edge portion of that surface of the laminate which surface faces the support plate, and on a lateral surface of the laminate. With this configuration, the present invention makes it possible to easily strip the support plate from the wafer in a short time.

Moreover, the second stripping device according to the present invention is a stripping device for stripping a support plate from a laminate including a substrate and the support plate adhered to the substrate via an adhesive layer, the stripping device comprising: retaining means for retaining on the laminate a solvent for dissolving the adhesive layer; at least one vibrating section for generating vibration to vibrate at least the solvent; and moving means for moving the at least one vibrating section relatively to the laminate. With this configuration, the present invention makes it possible to easily strip the support plate from the wafer in a shorter time.

DETAILED DESCRIPTION OF THE PREFERRED EMBODIMENTS

First Embodiment (Striping Device 10)

Figure 1:
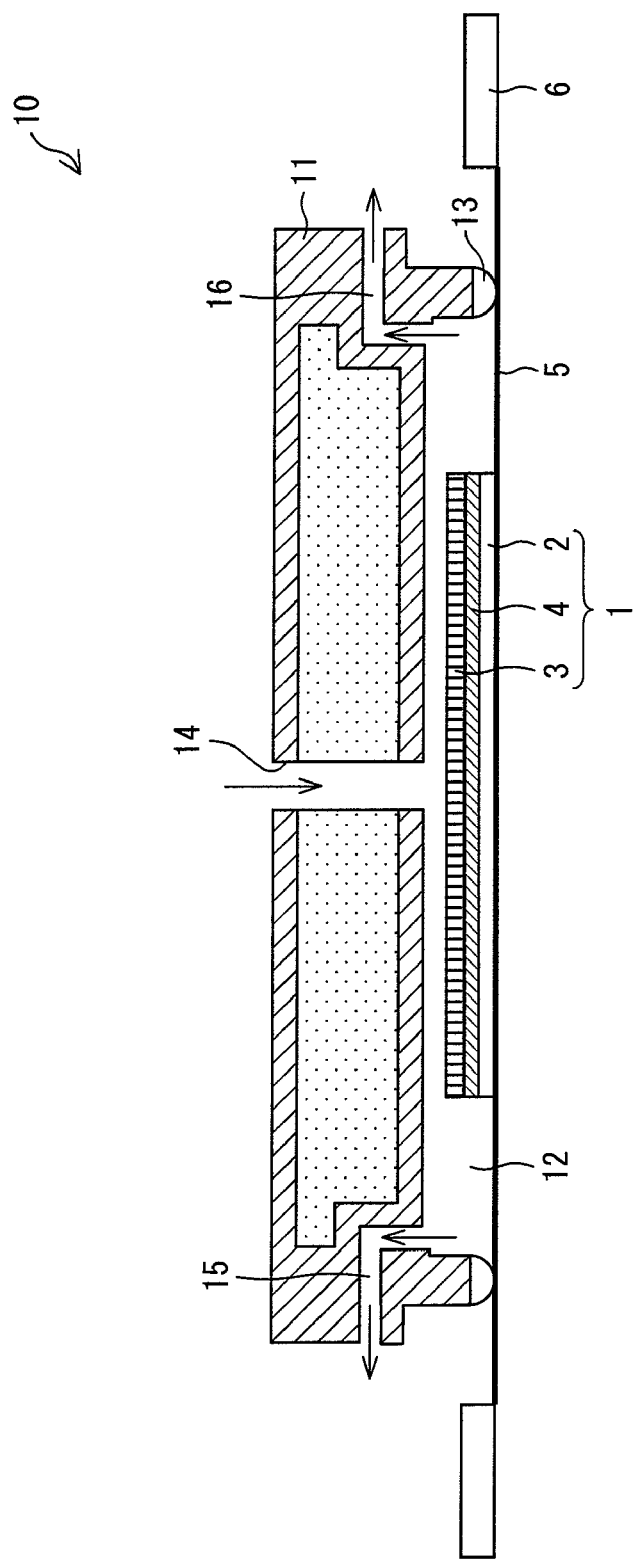
FIG. 1 is a cross sectional view schematically illustrating a stripping device according to one embodiment (first embodiment) of a first stripping device of the present invention.

One embodiment of a first stripping method and a first stripping device according to the present invention is described below referring to FIG. 1. FIG. 1 is a cross sectional view schematically illustrating a stripping device according to one embodiment (first embodiment) of a first stripping device of the present invention. A striping device 10 is a device for stripping a support plate 3 from a laminate 1 including a wafer (substrate) 2 and the support plate (support board) 3 adhered to the wafer 2 via an adhesive layer 4, which is a layer of an adhesive agent. The stripping device 10 includes a solvent supplying chamber (retaining means) 11 for forming a retaining section 12 in cooperation with a dicing tape 5 adhered to a wafer-2-side surface of the laminate 1. The retaining section 12 is for holding a solvent therein and is formed by causing the solvent supplying chamber 11 to touch the dicing tape 5. The dicing tape 5 is held by a dicing frame 6.

The solvent supplying chamber 11 is configured to contain the laminate 1 in an inside of the solvent supplying chamber 11, that is, the retaining section 12 of the solvent supplying chamber 11. The retaining section 12 is constituted by a space formed between the solvent supplying chamber 11 and the dicing tape 5 when the solvent supplying chamber 11 is caused to touch the dicing tape 5. The solvent supplying chamber 11 has a supplying opening 14 for supplying the solvent to the retaining section 12, and discharge openings 15 and 16 for discharging the solvent out of the retaining section 12. As one alternative, the solvent supplying chamber 14 may be configured such that the solvent is supplied from the openings 15 and 16 and discharged from the opening 14. A boundary where the solvent supplying chamber 11 and the dicing tape 5 is in contact is sealed with an O ring 13, so that the solvent supplied to the retaining section 12 will not leak out of the retaining section 12. Moreover, the leakage of the solvent out of the retaining section 12 may be prevented by, instead of using the O ring 13, for example, retaining the solvent inside the retaining section 12 by surface tension of the solvent between the solvent supplying chamber 11 and the dicing tape 5. What is required is that the retaining section 12 allows the solvent to be kept inside the retaining section 12 for a certain period of time so that the solvent can permeate into the laminate 1. For example, the retaining section 12 may be so configured to make a flow of the solvent in the retaining section 12 from the supplying opening 14 to the discharge openings 15 and 16.

The solvent supplying chamber 11 is so configured that the retaining section 12 constituted by the solvent supplying chamber 11 and the dicing tape 5 has an outer diameter larger than an outer diameter of the laminate 1. With this configuration, the solvent supplying chamber 11 can contain the laminate 1 within the retaining section 12 by covering a support-plate-3-side surface of the laminate 1 and lateral surface of the laminate 1. The retaining section 12 may or may not have a shape corresponding to a shape of the laminate 1. The retaining section may have any shape provided that the retaining section 12 can contain the laminate 1 inside thereof. For example, for a laminate 1 having a circular shape on its support-plate-3-side surface, the solvent supplying chamber 11 may or may not have a circular shape on a surface thereof facing the support plate 3, provided that the solvent supplying chamber 11 can contain the laminate 1 inside thereof.

The supplying opening 14 is provided at or near a center of the solvent supplying chamber 11. The solvent supplied via the supplying opening 14 at or near the center of the solvent supplying chamber 11 is retained in the retaining section 12 and then discharged out of the two discharging openings 15 and 16 of the solvent supplying chamber 11. The discharging openings 15 and 16 are provided on lateral side of the solvent supplying chamber 11. Therefore, the solvent is collected by being discharged from the lateral side of the laminate 1 after being retained inside of the solvent supplying chamber 11. The supplying opening 14 is a through hole of the solvent supplying chamber 11 and is opened on a laminate-1 side of the solvent supplying chamber 11. The discharge openings 15 and 16 are through holes of the solvent supplying chamber 11 and are opened on the laminate-1 side and lateral side of the solvent supplying chamber 11. The discharge openings 15 and 16 are connected with pressure reducing means (not illustrated) such as a vacuum pump, so that the solvent is discharged by applying reduced pressure on the discharge openings 15 and 16.

The adhesive layer 4 is formed from an adhesive compound soluble in a non-polar solvent or a highly polar solvent. Therefore, the solvent supplying chamber 11 supplies a non-polar solvent or a highly polar solvent as the solvent for dissolving the adhesive layer 4. That is, if the adhesive layer 4 is formed from an adhesive compound soluble in a non-polar solvent, the solvent supplying chamber 11 supplies the non-polar solvent as the solvent for dissolving the adhesive layer 4. Meanwhile, if the adhesive layer 4 is formed from an adhesive compound soluble in a highly polar solvent, the solvent supplying chamber 11 supplies the highly polar solvent as the solvent for dissolving the adhesive layer 4. Examples of the non-polar solvent and the highly polar solvent suitably usable as the solvent for dissolving the adhesive layer 4 will be given later.

Because the stripping device 10 is so arranged that the solvent for dissolving the adhesive layer 4 is a non-polar solvent or a highly polar solvent, the dicing tape 5 will not be damaged by the solvent even if the solvent touches the dicing tape 5. In general, an adhesive layer of the dicing tape 5 is formed from an acrylic adhesive agent, whereby the adhesive layer of the dicing tape 5 is tolerant against non-polar solvents and highly polar solvents. Therefore, without worrying about the consequences of the solvent touching the dicing tape 5, it is possible to supply the solvent so as to retain the solvent inside of the retaining section 12 in which the laminate 1 is contained, and then to cover the support-plate-3-side surface and lateral surface of the laminate 1 with the solvent.

Because the dicing tape 5 is damaged if the solvent touches the dicing tape 5, the conventional stripping device requires an O-ring so as to supply the solvent to the supply plate 3 but not to the dicing tape 5 in dissolving the adhesive layer. The O-ring seals the boundary where the solvent supplying chamber and the support plate 3 contact with each other. Because of this, it takes a long time to supply the solvent to an edge portion at which the support plate 3 has no hole. As a result, the stripping of the support plate 3 from the wafer 2 takes a long time.

With the stripping device 10 according to the present embodiment, the retaining section 12 is configured such that the solvent will be retained on the support-plate-3-side surface and lateral surface of the laminate 1. As a result, the solvent permeates into the laminate 1 via a through hole of the support plate 3 and reaches the adhesive layer 4. Further, the solvent permeates into the laminate 1 from the lateral side of the laminate 1 so as to reach the adhesive layer. Thus, a sufficient amount of the solvent permeates to the adhesive layer 4 in the edge portion in which the support plate 3 has no hole. As a result, the adhesive layer 4 can be efficiently dissolved at the edge portion as well. This makes it possible to strip the support plate 3 from the wafer in a shorter time.

(Laminate 1)

The laminate 1 is so configured that the wafer 2 and the support plate 3 are adhered with each other via the adhesive layer 4. In the present embodiment, the support plate 3 is a holed support plate 3 having a plurality of through holes in a thickness direction thereof. The use of the holed support plate 3 makes it possible to supply the solvent to the adhesive layer 4 via the though holes. The wafer 2 of the laminate 1 may or may not have a circular shape and may have a non-circular shape partially having an orientation flat. The support plate 3 can have any shape that can support the wafer 2. However, it is preferable that the support plate 3 has a shape corresponding to that of the wafer 2.

(Adhesive Layer 4)

The adhesive layer 4 is formed from an adhesive compound soluble in a non-polar solvent or a highly polar solvent. Therefore, the adhesive layer 4 is soluble with the non-polar solvent or the highly polar solvent, thereby allowing stripping the support plate 3 from the wafer 2.

Examples of the adhesive compound soluble in a non-polar solvent encompass hydrocarbon resins. Examples of the hydrocarbon resin encompass, but not limited to, resins having a constituent unit derived from cycloolefin, terpene-based resins, and the like. Moreover, one non-limiting example of the resins having a constituent unit derived from cycloolefin is a cycloolefin-based polymer (hereinafter may be referred to as a "resin A").

The resin A is a resin prepared by polymerizing a monomer component including a cycloolefin-based monomer (a1). More specifically, the resin A may be a open-ring (co)polymer of the monomer component including the cycloolefin-based monomer (a1), a resin prepared by addition (co)polymerization of the monomer component including the cycloolefin-based monomer (a1), and the like polymer.

Examples of the cycloolefin-based monomer (a1) contained in the monomer component constituting the resin (A) encompass: two-ring compounds such as norbornene and norbornadiene; three-ring compounds such as dicyclopentadiene and dihydroxypentadiene; four-ring compounds such as tetracyclododecene; five-ring compounds such as cyclopentadiene trimer; seven-ring compounds such as tetracyclopentadiene; these polycyclic compounds substituted with an alkyl (methyl, ethyl, propyl, butyl, etc.) group, with an alkenyl (vinyl etc.) group, with an alkylidene (ethylidene etc.) group, or an aryl (phenyl, tolyl, naphthyl, etc.) group; and the like. Among these, the cycloolefin-based monomer (a1) may be preferably a norbornene-based monomer being represented by the following general formula (1), and being selected from the group consisting of norbornene and tetracyclododecene, which are substituted or not substituted with an alkyl group.

[Chem. 1]

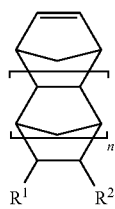
(1)

where $R_1$ and $R_2$ are independently a hydrogen or an alkyl group having 1 to 5 carbon atoms, and n is 0 or 1. The monomer components from which the resin A is produced may include, in addition to the cycloolefin-based monomer (a1), another monomer that is copolymerizable with the cycloolefin-based monomer (a1). Preferably, the another monomer may be, for example, an alkene monomer (a2) represented by the following general formula (2). Examples of the alkene monomer (a2) encompass ethylene, α-olefin, etc. The alkene monomer (a2) may be straight-chained or branched.

[Chem. 2]

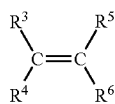
(2)

where $R_3$ to $R_6$ are independently a hydrogen or an alkyl group having 1 to 5 carbon atoms. It is preferable that 50% or more by mass of the monomer component constituting the resin A is the cycloolefin-based monomer (a1). It is more preferable that 60% or more by mass of the monomer component constituting the resin A is the cycloolefin-based monomer (a1). When 50% or more by mass of the monomer component constituting the resin A is the cycloolefin-based monomer (a1), the adhesive layer 4 has a good adhesive strength under high-temperature environment.

In order to prevent gas generation under high temperature, it is preferable that the resin (A) is a resin not having a polar group. One example of the resin not having a polar group is a resin prepared by polymerizing monomer components comprising the cycloolefin-based monomer (a1) represented by Formula (1) and the alkene monomer (a2) represented by Formula (2).

There is no particular limitation as to a polymerization method, polymerization conditions, etc. for the polymerization of the monomer component. Thus, the polymerization of the monomer component may be carried out by standard methods known to the art.

Examples of commercially-available resin (A) encompass "TOPAS" (product name, made by Polyplastics Co., Ltd.), "APEL" (product name, made by Mitsui Chemicals Inc.), "ZEONOR" and "ZEONEX" (product names, made by Zeon Corp.), and "ARTON" (product name, made by JSR corp.), etc.

It is preferable that a glass transition point (Tg) of the resin (A) is 60° C. or higher. It is more preferable that the glass transition point (Tg) of the resin (A) is 70° C. or higher. If the glass transition point (Tg) of the resin (A) is 60° C. or higher, it is possible to prevent the adhesive layer from softening that may be caused when the adhesive composition is exposed to high-temperature environment.

The terpene-based resin (hereinafter, may be referred to as a "resin (B)") encompass a terpene resin, terpene phenol resin, modified terpene resin, hydrogenated terpene resin, and hydrogenated terpene phenol resin, and the like. Among these, hydrogenated terpene resin is preferable.

It is important that the softening point of the resin (B) be in a range of 80 to 160° C. If the softening point of the resin (B) is lower than 80° C., the adhesive layer will be softened when the adhesive composition is exposed to high-temperature environment. Meanwhile, if the softening point of the resin (B) is higher than 160° C., the stripping rate for stripping by ungluing the adhesive composition will be slow.

It is important that the resin (B) have a molecular weight of 300 to 3000. If the molecular weight of the resin (B) is less than 300, the adhesive layer will have insufficient heat tolerance, thereby causing gas generation under high-temperature environment. On the other hand, if the molecular weight of the resin (B) is greater than 3000, the stripping rate for stripping by ungluing the adhesive composition will be slow. In the present invention, the molecular weight of the resin (B) is a polystyrene-based molecular weight measured by gel permeation chromatography (GPC).

The adhesive compound may include both or one of the resins (A) and (B). If the adhesive compound includes both of the resins (A) and (B), the resin (A) and the resin (B) are in such a ratio that (A):(B)=80:20 to 55:45 (by mass). If the resin (A) is contained more than the ratio (in other words, if the resin (B) is contained less than the ratio), the stripping ratio for stripping by ungluing the adhesive composition will be slow. On the other hand, if the resin (A) is contained less than the ratio (in other words, if the resin (B) is contained more than the ratio), the adhesive layer will be softened when the adhesive composition is exposed to high-temperature environment. The softening would cause adhesion failure.

Examples of the adhesive compound soluble in a highly polar solvent encompass, but not limited to, collagen peptide, cellulose, polyvinyl alcohol (PVA), starch, etc.

The collagen peptide can be generated by hydrolysis of a gelatin prepared by thermally denaturing collagen molecules in such a manner that helically-entangled polypeptide chains of the collagen molecules are partially detangled by thermal denaturing. The collagen molecules may be mammalian collagen molecules and fish collagen, preferably. The collagen molecules may be commercially available collagen molecules. The collagen molecules is preferably such that the collagen peptide prepared from the collagen molecule is dissolved into the polar solvent preferably at a dissolving rate of 100 to 300 nm/sec, and especially preferably of 200 nm/sec.

The adhesive layer 4 is formed from the adhesive compound soluble in the non-polar solvent or the highly polar solvent, and may be chosen as appropriate for treatment to which the laminate 1 is to be subjected. For example, if a large amount of water is to be used in a thinning process of the wafer 2, it is preferable to use an adhesive layer 4 formed from the adhesive compound soluble in the non-polar solvent, because an adhesive compound soluble in the highly polar solvent would possibly be dissolved in the water.

As to a layer thickness of the adhesive layer 4, the adhesive layer 4 should have a layer thickness that secures the adhesion between the wafer 2 and the support plate 3, and that provides the adhesive layer 4 with heat tolerance. The adhesive layer 4 may be formed by applying the adhesive compound on the wafer 2 or the support plate 3 and solidifying the adhesive compound to form a layer of the adhesive compound. As one alternative, a layer of the adhesive compound formed in advance by solidifying the adhesive compound may be applied to the wafer 2 or the support plate 3, so as to form the adhesive layer 4.

(Stripping Method)

A stripping method according to one embodiment of the first stripping method of the present invention is a stripping method for stripping the support plate 3 from the laminate 1 including the wafer 2 and the support plate 3 adhered to the wafer 2 via the adhesive layer 4 formed from the adhesive compound soluble in the non-polar solvent or the highly polar solvent, the method comprising the step of supplying the non-polar solvent or the highly polar solvent in such a manner that the non-polar solvent or the highly polar solvent is retained, at least, over an edge portion of a support-plate-3-side surface of the laminate 1, and over lateral surface of the laminate 1.

The step of supplying supplies the solvent to the laminate 1, wherein the laminate 1 is to be treated with the stripping treatment and the solvent is a solvent to dissolve the adhesive layer 4. The step of supplying supplies the non-polar solvent or the highly polar solvent in such a manner that the non-polar solvent or the highly polar solvent is retained to cover at least the support-plate-3-side surface of the laminate 1, and the lateral surface of the laminate 1. In case where the stripping device 10 is used to strip the support plate 3 from the wafer 2, the solvent supplying chamber 11 is configured to cover the laminate 1 with the retaining section 12. With this configuration, the solvent supplied to the retaining section 12 is retained in the retaining section 12 in such a manner that the solvent covers the support-plate-3-side surface of the laminate 1, and the lateral surface of the laminate 1, so as to soak the laminate 1 in the solvent.

The adhesive layer 4 is formed from the adhesive compound soluble in the non-polar solvent or the highly polar solvent. Thus, as the solvent for dissolving the adhesive layer 4, the non-polar solvent or the highly polar solvent is used in the step of supplying. That is, if the adhesive layer 4 is formed from the adhesive compound soluble in the non-polar solvent, the solvent used in the step of supplying is the non-polar solvent. If the adhesive layer 4 is formed from the adhesive compound soluble in the highly polar solvent, the solvent used in the step of supplying is the highly polar solvent.

The non-polar solvent may be suitably a non-polar solvent having a solubility parameter (SP value) of 8 or less. It is preferable that the non-polar solvent is a non-polar solvent having a SP value of 7.4 or less. Examples of such a non-polar solvent having a SP value of 7.4 or less encompass: hydrocarbon-based solvents such as terpene-based solvent (menthane, limonene, pinene, etc.), toluene, xylene, n-hexane, isohexane, cyclohexane, methylcyclohexane, heptane, octane, nanone, etc.; fluorine-based solvents; and the like.

The highly polar solvent may be suitably a conventionally known polar solvent. It is preferable that the highly polar solvent is a polar solvent having a SP value of 10 or more. It is more preferable that the highly polar solvent is a polar solvent having a SP value of 12 or more. Examples of the polar solvent having a SP value of 12 or more encompass water, methanol, ethanol, isopropyl alcohol, etc.

Solubility of two types of dicing tapes (Tape A (polyolefin resin) and Tape B (vinyl chloride resin)) was evaluated with respect to difference in the polarity of the solvents. Each dicing tape was cut into cut samples of a size of 30 mm×50 mm and a pretreatment weight of each dicing tape was measured by using an electronic scale. Next, the cut samples of each dicing tape were respectively soaked for 10 minutes in solvents of a liquid temperature of 23° C. (normal temperature). The solvents used in the test were menthane (SP value=7.0), MAK (2 heptane; SP value=9.0), PGMEA (propylene glycol monomethyl ether acetate; SP value=9.2), ethanol (SP value=12.9), water (SP value=23.4). After the soaking in the solvents, the cut samples were dried for 30 minutes by using an oven that was set at 60° C. Then, a post-treatment weight of each cut sample was measured by using the electronic scale.

As a result, a weight change due to dissolution was observed in Tape A for MAK, PGMEA, and ethanol, while no weight change due to dissolution was observed in Tape A for menthane (the lowly polar solvent) and water (highly polar solvent). As to Tape B, a weight change due to dissolution was also observed in Tape B for MAK, PGMEA, and ethanol. Especially, it was observed that Tape B was dissolved quite significantly in MAK and PGMEA, which are polar solvents. Meanwhile, no weight change due to dissolution was observed in Tape B for menthane (the lowly polar solvent) and water (highly polar solvent) as well.

As demonstrated above, the use of the non-polar solvent or the highly polar solvent for dissolving the adhesive layer 4 in the step of supplying prevents the dicing tape 5 from being damaged by the solvent that may touch the dicing tape. The adhesive layer of the dicing tape 5 is generally formed from acrylic adhesive agent, and thus is tolerant against the non-polar solvent and the highly polar solvent. Therefore, when supplying the solvent so as to cover the support-plate-3-side surface and the lateral surface of the laminate 1 with the solvent, it is not necessary to worry about the consequences of the solvent touching the solvent touches the dicing tape 5.

In the conventional stripping method, the solvent would damage the dicing tape 5 when the solvent touches the dicing tape 5. To avoid this problem, the dissolving the adhesive layer in the conventional stripping method should be arranged such that the solvent is supplied to the support plate 3 but not to the dicing tape 5 so that the solvent does not touch the dicing tape 5. Due to this, it takes a long time to supply the solvent especially to the edge portion of the support plate 3 in which edge portion no hole is provided. As a result, the stripping the support plate 3 to the wafer 2 takes a long time.

According to the stripping method of the present embodiment, the solvent is supplied, so that the solvent is retained on the support-plate-3-side surface and lateral surface of the laminate 1. The solvent permeates into the laminate 1 through the though holes of the support plate 3 so as to reach the adhesive layer 4. Further, the solvent reaches the adhesive layer 4 from the lateral side of the laminate 1. Therefore, the solvent sufficiently permeates to the adhesive layer 4 at the edge portion at which the support plate 3 has no hole. Thereby, the adhesive layer 4 can be dissolved efficiently. As a result, it is possible to strip the support plate 3 from the wafer 2 in a shorter time. In order to facilitate the solvent to permeate into and to dissolve the adhesive layer 4, a temperature of the solvent to be supplied may be adjusted as appropriate.

In the stripping method according to the present embodiment, the solvent supplied by the step of supplying is retained on the laminate 1 and then collected (step of collecting). The step of collecting collects the solvent from the lateral side of the laminate 1. After the adhesive layer is dissolved and the solvent is collected by the step of collecting, the support plate 3 is stripped from the wafer 2. It may be arranged such that, after stripping the support plate 3 from the wafer 2, the non-polar solvent or the high-polar solvent is supplied to the wafer 2 so as to wash the wafer 2 with the non-polar solvent or the high-polar solvent. This washing removes the adhesive layer 4 residual on the wafer 2.

One example of the step of supplying and the step of collecting in the stripping method according to the present embodiment is described more specifically below in reference to (a) to (f) of FIG. 2, which are views schematically illustrating the stripping method according to one embodiment of the first stripping method of the present invention. The present embodiment is explained, referring to an case in which the O ring 13 is used to seal the boundary where the solvent supplying chamber 11 and the dicing tape 5 touch each other.

Figure 2:
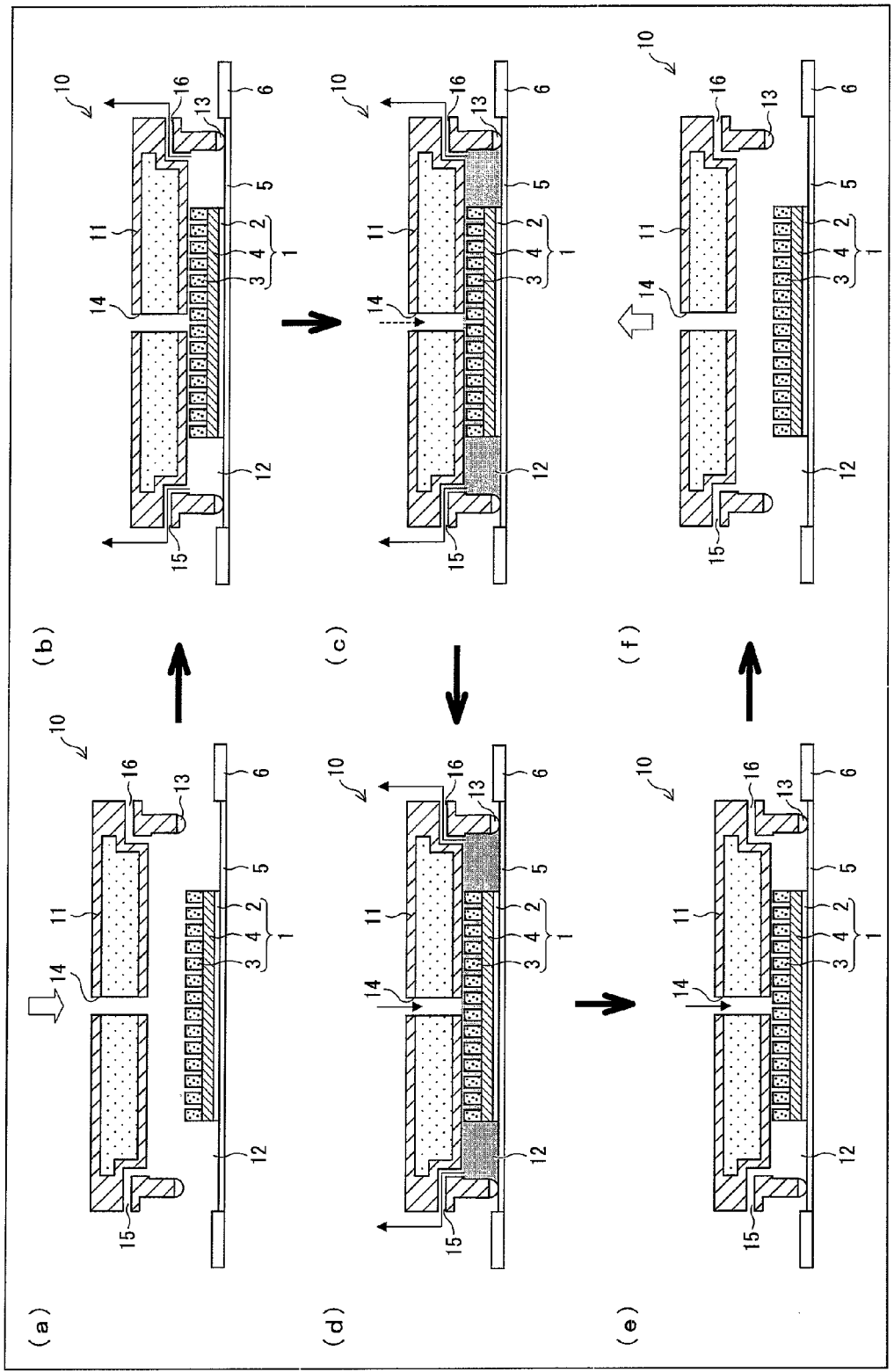
FIGS. 2(a)-(f) are views schematically illustrating a stripping method according to one embodiment (first embodiment) of a first stripping method of the present invention.

To begin with, as illustrated in (a) of FIG. 2, the solvent supplying chamber 11 is moved above the laminate 1 and lifted down until the O ring 13 touches the dicing tape 5. The O ring 3 has an outer diameter greater than the outer diameter of the laminate 1. Thus, the solvent supplying chamber 11 is placed over the laminate 1 such that the solvent supplying chamber 11 covers the laminate 1.

Next, as illustrated in (b) of FIG. 2, an air inside the retaining section 12 formed between the solvent supplying chamber 11 and the dicing tape 5 is sucked out from the discharging openings 15 and 16, so as to lower pressure inside the retaining section 12. Then, as illustrated in (c) of FIG. 2, the solvent is supplied into the retaining section 12 via the supplying opening 14. The solvent is supplied into the retaining section 12 via the supplying opening 14, while the solvent is sucked via the discharging openings 15 and 16. Thereby, the solvent is retained inside the retaining section 12. The solvent into the retaining section 12 is supplied by initial supply of 60 sec. Then, 5 to 20-min vibrating treatment is carried out by using a vibrating section 27 as described in the later-described second embodiment, for example.

Then, as illustrated in (d) of FIG. 2, lowering the pressure inside the retaining section 12 is stopped and the air is introduced into the retaining section 12 (releasing the pressure to atmosphere). After that, the solvent inside the retaining section 12 is sucked out from the discharging openings 15 and 16, thereby discharging the solvent out of the retaining section 12. As illustrated in (e) of FIG. 2, the air is introduced into the retaining section 12, thereby bringing the pressure in the retaining section 12 to the atmospheric pressure. Then, as illustrated in (f) in FIG. 2, the solvent supplying chamber 11 is moved up at the end the supplying and the step of collecting. The supplied solvent evenly permeates in the adhesive layer 4 of the laminate 1, thereby dissolving the adhesive layer 4 in a short time. As a result, the stripping the support plate 3 from the wafer 2 can be carried out in a shorter time.

Second Embodiment (Striping Device 20)

Figure 3:
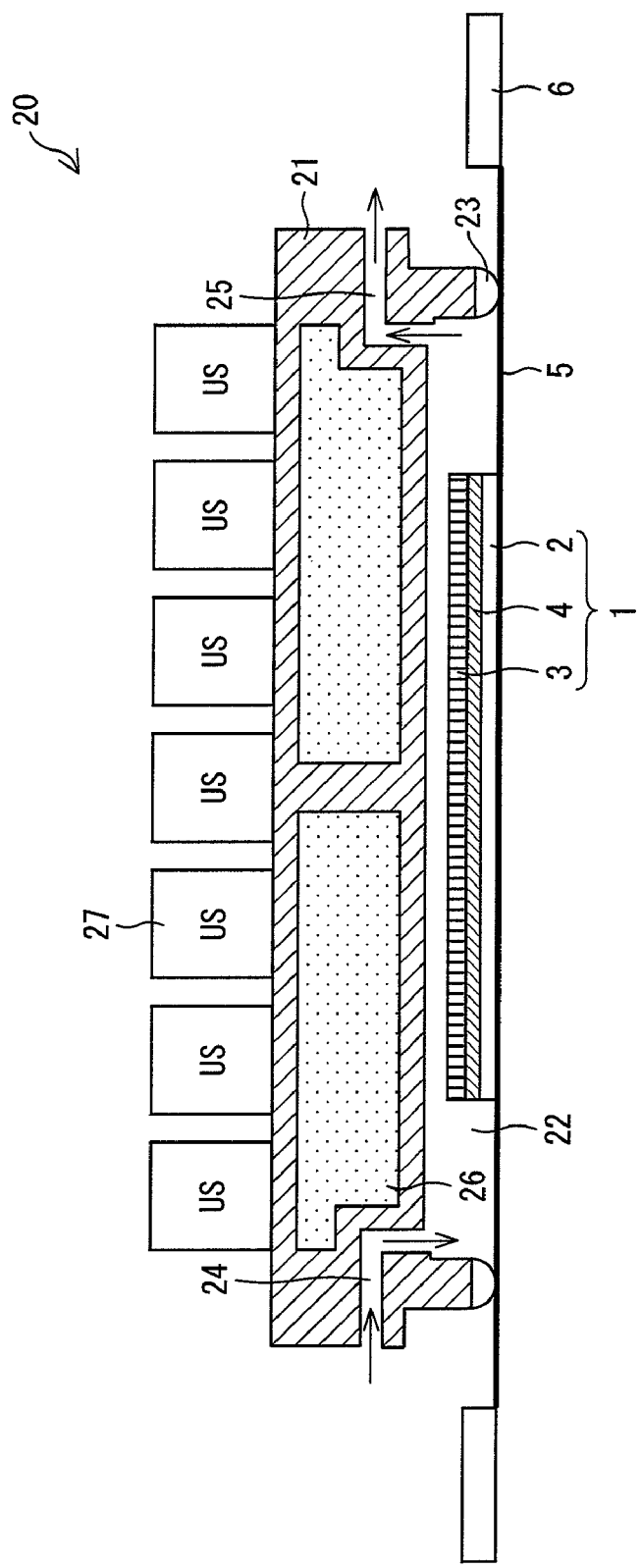
FIG. 3 is a cross sectional view schematically illustrating a stripping device according to another embodiment (second embodiment) of the first stripping device of the present invention.
Figure 4:
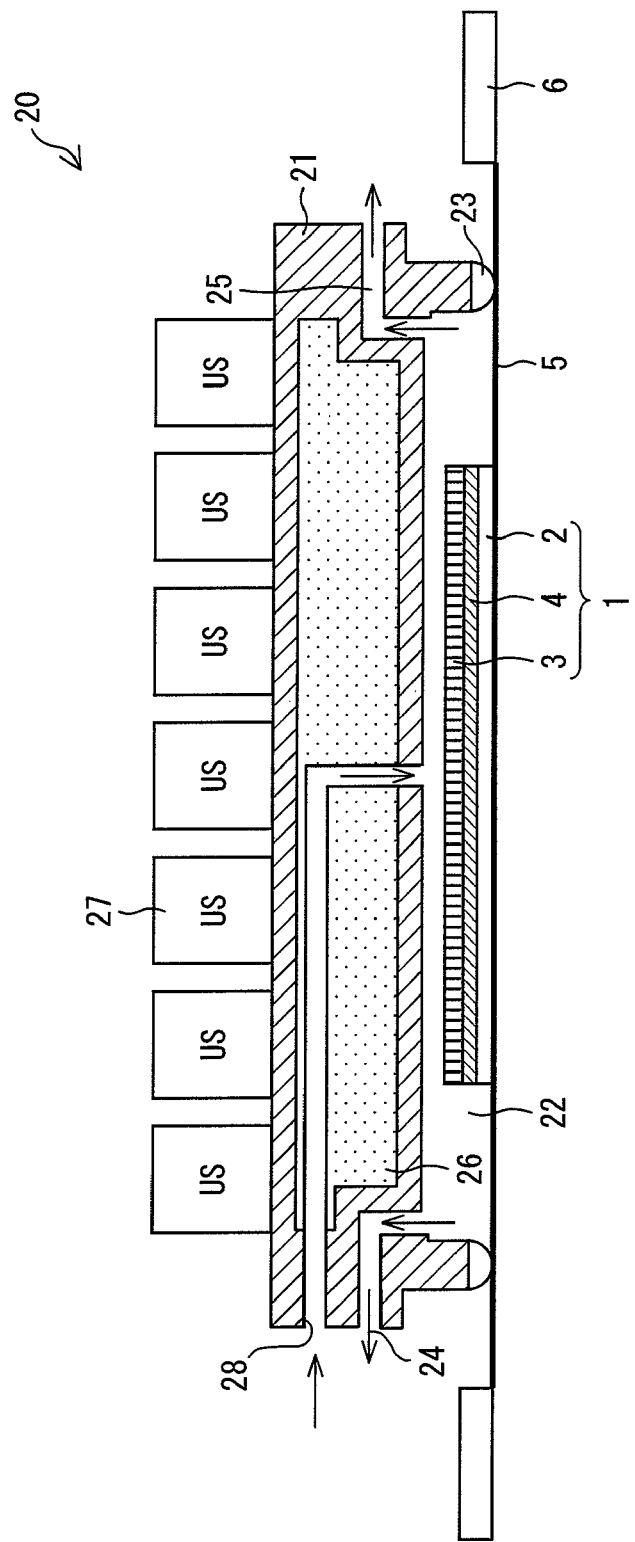
FIG. 4 is a cross sectional view schematically illustrating the stripping device according to the another embodiment (second embodiment) of the first stripping device of the present invention.

Another embodiment of a first stripping method and a first stripping device according to the present invention is described below referring to FIGS. 3 and 4. FIGS. 3 and 4 are cross sectional views schematically illustrating a stripping device according to the another embodiment (second embodiment) of the first stripping device of the present invention. A striping device 20 includes a solvent supplying chamber (retaining means) 21, which forms a retaining section 22 when the solvent supplying chamber 21 touches the dicing tape 5 adhered on the wafer-2-side surface of the laminate 1. The retaining section 22 is configured to retain the solvent between the solvent supplying chamber 21 and the dicing tape 5.

The solvent supplying chamber 21 is so configured to contain the laminate 1 inside thereof, that is, inside the retaining section 22. The retaining section 22 is constituted by a space formed between, the solvent supplying chamber 21 and the dicing tape 5 when the solvent supplying chamber 21 touches the dicing tape 5. The solvent supplying chamber 21 has a supplying opening 24 and the discharging opening 25 on its lateral side. The supplying opening 24 is for supplying the solvent into the retaining section 22, and the supplying opening 25 is for discharging the solvent out of the retaining section 22. As one alternative, the solvent supplying chamber 21 may be configured such that the solvent is supplied into the retaining section 22 via the opening 25 and discharged out of the retaining section 22 via the opening 24. Moreover, as illustrated in FIG. 4, the solvent supplying chamber 21 may be configured such that a center supplying opening 28 is provided in the solvent supplying chamber 21 so that the solvent is supplied into the retaining section 22 via the center supplying opening 28 and discharged out of the retaining section 22 via the openings 24 and 25. The boundary where the solvent supplying chamber 21 and the dicing tape 5 is in contact is sealed with an O ring 23, so that the solvent supplied to the retaining section 22 will not leak out of the retaining section 22. Moreover, the leakage of the solvent out of the retaining section 22 may be prevented by, instead of using the O ring 23, for example, retaining the solvent inside the retaining section 22 by surface tension of the solvent between the solvent supplying chamber 21 and the dicing tape 5.

The stripping device 20 comprises a vibration transmitting section 26 for transmitting vibration to the solvent retained in the retaining section 22, the vibration being generated by a vibrating section 27 provided on the solvent supplying chamber 21. The vibration transmitting section 26 is located between the vibrating section 27 and the retaining section 22. The vibration transmitting section 26 may be integrated with the solvent supplying chamber 21. The vibration transmitting section 26 is for transmitting to the solvent retained in the retaining section 22 the vibration generated by the vibrating section 27. The vibration transmitting section 26 may be constituted by a case-like structure having a hollow inside.

The hollow inside the vibration transmitting section 26 is formed in a doughnut-like shape around the center of the solvent supplying chamber 21. The vibration transmitting section 26 is configured such that the hollow is located under the vibrating section 27. The hollow of the vibrating section may contain a liquid. The liquid inside the hollow of the vibration transmitting section 26 can spread through the liquid the vibration caused by the vibrating section 27. Thus, the vibration caused by the vibrating section 27 can be transmitted to a wider range.

The vibration transmitting section 26 is preferably made from a metal, such as stainless steel, that a good transmission efficiency of vibration, so that the vibration transmitting section 26 can efficiently transmit to the solvent inside the retaining section 22 the vibration caused by the vibrating section 27. It is preferable that the vibration transmitting section 26 has such a dimension in a thickness direction that an amplitude of the vibration transmitted from the vibrating section 27 reaches its peak when the vibration reaches a retaining section-22 side surface of the vibration transmitting section 26. This allows efficient transmission of the vibration to the solvent inside the retaining section 22.

The vibrating section 27 may be, for example, a vibrator that vibrates itself for generating vibration, a ultrasonic wave generator for generating ultrasonic wave (US), or the like device. The present invention is not limited to the present embodiment, in which seven (7) vibrators 27 for generating ultrasonic waves are provided on the solvent supplying chamber 21. At least one vibrating section 27 is provided on the solvent supplying chamber 21 in order to generate the vibration. Moreover, the vibrating sections 27 is preferably arranged with even intervals so that the vibration from the vibrating section 27 is transmitted to the whole solvent retained inside the retaining section 22.

The solvent supplying chamber 21, the vibrating section 26, and the vibrating section 27 may be configured to move around the laminate 1 while the solvent is retained in the retaining section 22. In case of a stripping device 20 in which the solvent supplying chamber 21 and the vibration transmitting section 26 are integrated and the vibrating section 27 is provided on the vibration transmitting section 26, it is possible to rotate the solvent supplying chamber 21 on the dicing tape 5 which the solvent supplying chamber 21 touches via the O ring 23. In this way, the solvent supplying chamber 21, the vibration transmitting section 26, and vibrating section 27 can be rotated together around the laminate 1.

During the rotation of the solvent supplying chamber 21 about the laminate 1, the solvent inside the retaining section 22 will not be leaked out because the O ring 23 seals the boundary between the solvent supplying chamber 21 and the dicing tape 5. Here, the O ring 23 is preferably configured to prevent the leakage of the solvent but not to disturb the rotation of the solvent supplying chamber 21. For example, a Teflon (registered trademark) capsule O ring etc. can be used suitably. Moreover, it may be arranged such that after discharging the solvent out of the retaining section 22 and lifting up the solvent supplying chamber 21, the solvent supplying chamber 21 is rotated, and then lowered down until the O ring 23 touches the dicing tape 5, so that the solvent is supplied into the retaining section 22 again. The solvent supplying chamber 21 may be rotated continuously, or in an intermitted manner such as rotating it by 30 degree and then stop rotating for a while and then again rotating it by 30 degree. The rotation of the solvent supplying chamber 21 may be started after the vibration caused by the vibrating section 27 is started.

The rotation of the solvent supplying chamber 21, the vibrating transmitting section 26, and the vibrating section 27 about the laminate 1 causes uniform transmission of the vibration from the vibrating section 27 through the solvent inside the retaining section 22, thereby allowing uniform permeation of the solvent over whole surface of the laminate 1. This prevents the adhesive layer 4 from being incompletely dissolved. As a result, it is possible to dissolve the adhesive layer 4 in a shorter time, thereby making it possible to strip the support plate 3 from the wafer 2 in a shorter time.

Moreover, the stripping device 20 is so configured that the supplying opening 24, the discharging opening 25 and the center supplying opening 28 are opened on the lateral side of the solvent supplying chamber 21. This allows providing the vibrating section 27 at the center portion of the solvent supplying chamber 21. This allows efficient transmission of the vibration caused by the vibrating section 27 to the center portion of the laminate 1. This more efficiently prevents the adhesive layer 4 from being incompletely dissolved.

Third Embodiment

Figure 5:
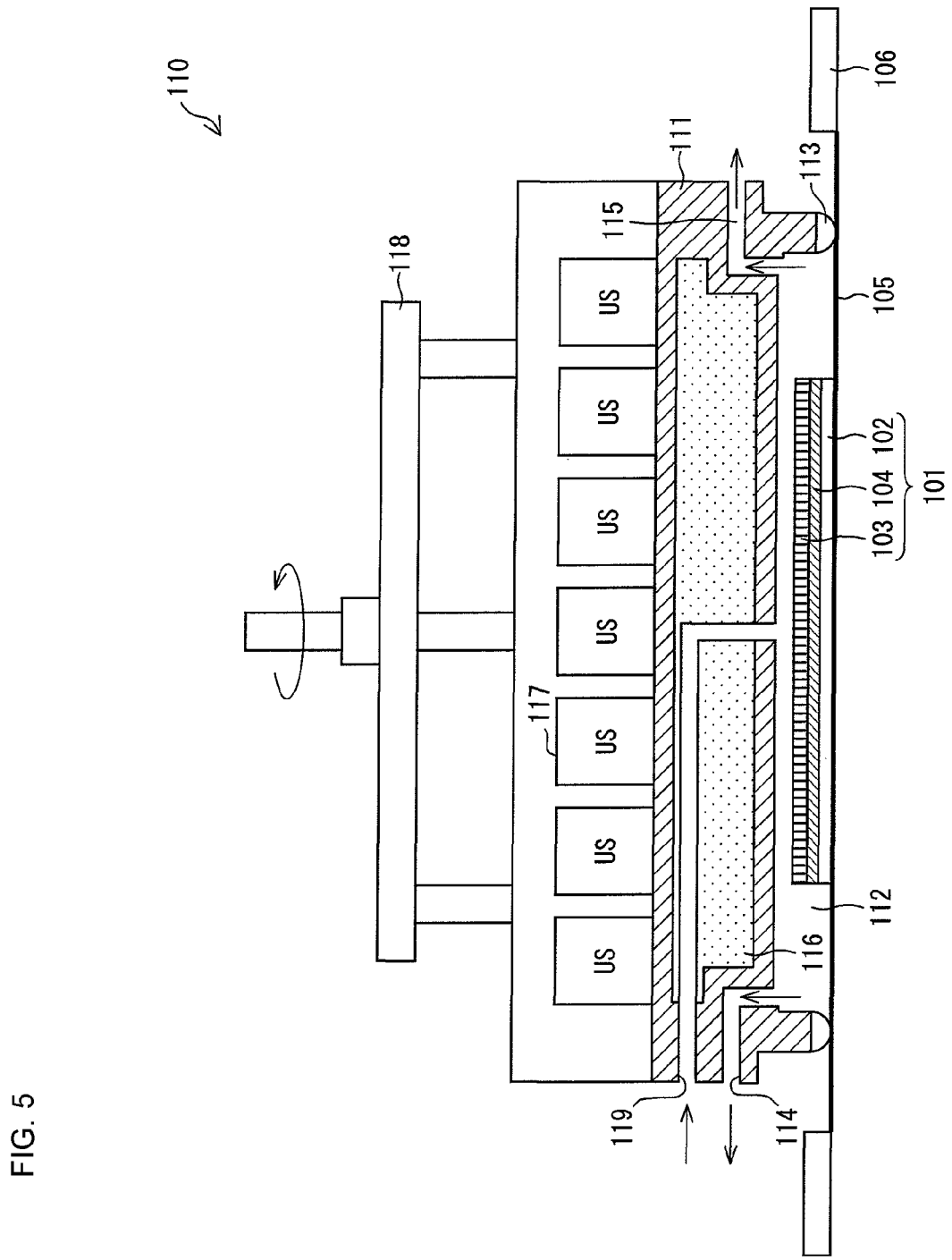
FIG. 5 is a cross sectional view schematically illustrating a stripping device according to one embodiment (third embodiment) of the second stripping device of the present invention.

A stripping device according one embodiment of a second stripping method and a second stripping device of the present invention is described below referring to FIG. 5, which a cross sectional view schematically illustrating a stripping device 110 according to the present embodiment of the second stripping device of the present invention. The stripping device 110 is a device for stripping a support plate 103 from a laminate 101 including a wafer (substrate) 102 and the support plate 103 adhered to wafer 102 via an adhesive layer 104. The stripping device 110 comprises a solvent supplying chamber (retaining means) 111 for supplying a solvent to the laminate 101, and for retaining solvent on the laminate 101, the solvent dissolving the adhesive layer 104. A dicing tape 105 adhered to the laminate 101 is held by a dicing frame 106.

In the present embodiment, the solvent supplying chamber 111 forms the retaining section 112 when the solvent supplying chamber 111 reaches, from a support plate 103 side, the dicing tape 105 on a wafer 102 side. The retaining section 112 is configured to retain the solvent therein. The solvent supplying chamber 111 is so configured to contain the laminate 101 inside thereof, that is, inside the retaining section 112. The retaining section 112 is constituted by a space formed between the solvent supplying chamber 111 and the dicing tape 105 when the solvent supplying chamber 111 touches the dicing tape 105.

The solvent supplying chamber 111 has, on its lateral side, a center supplying opening (supplying opening) 119 for supplying the solvent to the retaining section 112, and discharge openings (collecting openings) 114 and 115 for discharging the solvent out of the retaining section 115. The solvent supplying chamber 111 may be so configured that the solvent is supplied via the openings 114 and 115 and the solvent is discharged via the opening 119. The central supplying opening 119 is a through hole opened on a center portion of a laminate-101 side of the solvent supplying chamber 111 and opened on the lateral side of the solvent supplying chamber 111. The discharging openings 114 and 115 are through holes opened on the laminate-101 side of the solvent supplying chamber 111 and opened on the lateral side of the solvent supplying chamber 111. The discharging openings 114 and 115 are connected with pressure reducing means (not illustrated) such as a vacuum pump, so that the solvent is discharged by applying reduced pressure on the discharge openings 114 and 115.

A boundary where the solvent supplying chamber 111 and the dicing tape 105 is in contact is sealed with an O ring 113, so that the solvent supplied to the retaining section 112 will not leak out of the retaining section 112. Moreover, the leakage of the solvent out of the retaining section 112 may be prevented by, instead of using the O ring 113, for example, retaining the solvent inside the retaining section 112 by surface tension of the solvent between the solvent supplying chamber 111 and the dicing tape 105. What is required is that the retaining section 112 allows the solvent to be inside the retaining section 112 for a certain period of time so that the solvent can permeate into the laminate 1. For example, the retaining section 112 may be so configured to make a flow of the solvent in the retaining section 112 from the center supplying opening 119 to the discharge openings 114 and 115. The stripping device 110 includes at least one vibrating section 117 for vibrating at least the solvent supplied in the solvent supplying chamber 111, the vibrating section 117 being provided on the solvent supplying chamber 111. Further, the stripping device 110 includes a vibration transmitting section 116 for transmitting to the solvent retained inside the retaining section 112 the vibration caused by the vibrating section 117. The vibration transmitting section 116 is provided between the vibrating section 117 and the retaining section 112. The vibrating transmitting section 116 may be integrated with the solvent supplying chamber 111. The vibration transmitting section 116 is configured to transmit to the solvent retained in the retaining section 112 the vibration caused by the vibrating section 117. The vibration transmitting section 116 may be constituted by a case-like structure having a hollow inside.

The hollow inside the vibration transmitting section 116 is formed in a doughnut-like shape around the center of the solvent supplying chamber 111. The vibration transmitting section 116 is configured such that the hollow is located under the vibrating section 117. The hollow of the vibrating section may contain a liquid. The liquid inside the hollow of the vibration transmitting section 116 can spread through the liquid the vibration caused by the vibrating section 117. Thus, the vibration caused by the vibrating section 117 can be transmitted to a wider range.

The vibration transmitting section 116 is preferably made from a metal, such as stainless steel, that a good transmission efficiency of vibration, so that the vibration transmitting section 116 can efficiently transmit to the solvent inside the retaining section 112 the vibration caused by the vibrating section 117. It is preferable that the vibration transmitting section 116 has such a dimension in a thickness direction that an amplitude of the vibration transmitted from the vibrating section 117 reaches its peak when the vibration reaches a retaining section-112 side surface of the vibration transmitting section 116. This allows efficient transmission of the vibration to the solvent inside the retaining section 112.

The vibrating section 117 may be, for example, a vibrator that vibrates itself for generating vibration, a ultrasonic wave generator for generating ultrasonic wave (US), or the like device. The present invention is not limited to the present embodiment, in which seven (7) vibrators 117 for generating ultrasonic wave are provided on the solvent supplying chamber 111. At least one vibrating section 117 is provided on the solvent supplying chamber 111 in order to generate the vibration. Moreover, the vibrating section 117 is preferably arranged with even intervals so that the vibration from the vibrating section 117 is transmitted to the whole solvent retained inside the retaining section 112.

The stripping device 110 is further provided with a rotating section (moving means) 118 for moving the vibrating section relatively to the laminate 101. In the present embodiment, the rotating section 118 lifts up and down the solvent supplying chamber 111 above the laminate 101, and then the rotating section 118 with the solvent supplying chamber 111 rotates above the laminate 101, thereby causing the vibrating section 117 to move relatively to the laminate 101. In case where the vibration transmitting section 116 is integrated with the solvent supplying chamber 111, the rotation of the solvent supplying chamber 111 causes the vibration transmitting section 116 to rotate about the laminate 101. The vibrating section 117 provided on the vibration transmitting section 116 is moved along a periphery of the laminate 101.

By causing the solvent supplying chamber 111 and the vibration transmitting section 116 to move along a periphery of the laminate 101 in this way, the rotating section 118 causes the vibrating section 117 to move relatively to the laminate 101. By this, the vibration from the vibrating section 117 is uniformly transmitted to the solvent inside the retaining section 112, thereby allowing uniform permeation of the solvent over whole surface of the laminate 101. This prevents the adhesive layer 104 from being incompletely dissolved. As a result, it is possible to dissolve the adhesive layer 104 in a shorter time, thereby making it possible to strip the support plate 103 from the wafer 102 in a shorter time. Moreover, the stripping device 110 is so configured that the discharging openings 114 and 115 and the center supplying opening 119 are opened on the lateral side of the solvent supplying chamber 111. This allows providing the vibrating section 117 at the center portion of the solvent supplying chamber 111. This allows efficient transmission of the vibration caused by the vibrating section 117 to the center portion of the laminate 101. This more efficiently prevents the adhesive layer 104 from being incompletely dissolved.

Here, the solvent supplying chamber 111 is so configured that the retaining section 112 constituted by the solvent supplying chamber 111 and the dicing tape 105 has a largest outer diameter larger than an outer diameter of the laminate 101. With this configuration, the solvent supplying chamber 111 can contain the laminate 1 within the retaining section 112 by covering a support-plate 103-side surface of the laminate 101 and lateral surface of the laminate 101. A surface, facing the support-plate-103 side of the laminate 101, of the retaining section 112 may or may not have a shape corresponding to a shape of the laminate 101. That is, the retaining section 112 may or may not have a shape corresponding to a shape of the laminate 101. The retaining section may have any shape provided that the retaining section 112 can contain the laminate 101 inside thereof. For example, for a laminate 101 having a shape with an orientation flat on its support-plate-103 side, the solvent supplying chamber 111 may or may not have a shape corresponding to the shape with an orientation flat (e.g. may have a circular shape without an orientation flat) on a surface thereof facing the support plate 103, provided that the solvent supplying chamber 111 can contain the laminate 101 inside thereof.

The rotating section 118 may rotate the solvent supplying chamber 111 continuously, or in an intermitted manner such as rotating it by 30 degree and then stop rotating for a while and then again rotating it by 30 degree. The rotation of the solvent supplying chamber 111 may be started after the vibration caused by the vibrating section 117 is started, and the rotation of the solvent supplying chamber 111 and the vibration of the vibrating section 117 are carried out concurrently. Moreover, the rotation of the solvent supplying chamber 111 and the vibration of the vibrating section 117 may be carried out alternatively, for example, in such a manner that after the vibration of the vibrating section 117 is stopped, the rotation of the solvent supplying chamber 111 is started, and then after the rotation of the solvent supplying chamber 111 is stopped, the vibration of the vibrating section 117 is resumed.

During the rotation of the solvent supplying chamber 111 about the laminate 101, the solvent inside the retaining section 112 will not be leaked out because the O ring 113 seals the boundary between the solvent supplying chamber 111 and the dicing tape 105. Here, the O ring 113 is preferably configured to prevent the leakage of the solvent but not to disturb the rotation of the solvent supplying chamber 111. For example, a Teflon (registered trademark) capsule O ring etc. can be used suitably. Moreover, it may be arranged such that after discharging the solvent out of the retaining section 112 and lifting up the solvent supplying chamber 111, the solvent supplying chamber 111 is rotated, and then lowered down until the O ring 113 touches the dicing tape 105, so that the solvent is supplied into the retaining section 112 again.

Here, the adhesive layer 104 is formed from an adhesive compound soluble in a non-polar solvent or a highly polar solvent. Therefore, as the solvent for dissolving the adhesive layer 104, the solvent supplying chamber 111 supplies the non-polar solvent or the highly polar solvent as via the center supplying opening 119. That is, if the adhesive layer 104 is formed from an adhesive compound soluble in a non-polar solvent, the solvent supplying chamber 111 supplies the non-polar solvent as the solvent for dissolving the adhesive layer 104. Meanwhile, if the adhesive layer 104 is formed from an adhesive compound soluble in a highly polar solvent, the solvent supplying chamber 111 supplies the highly polar solvent as the solvent for dissolving the adhesive layer 104.

Examples of the non-polar solvent and the highly polar solvent suitably usable as the solvent for dissolving the adhesive layer 104 will be given later.

Because the stripping device 110 is so arranged that the solvent for dissolving the adhesive layer 104 is a non-polar solvent or a highly polar solvent, the dicing tape 105 will not be damaged by the solvent even if the solvent touches the dicing tape 105. In general, an adhesive layer of the dicing tape 105 is formed from an acrylic adhesive agent, whereby the adhesive layer of the dicing tape 105 is tolerant against non-polar solvents and highly polar solvents. Therefore, without worrying about the consequences of the solvent touching the dicing tape 105, it is possible to supply the solvent so as to retain the solvent inside the retaining section 112 in which the laminate 101 is contained, and then to cover the support-plate-103-side surface and lateral surface of the laminate 101 with the solvent.

Because the dicing tape 105 is damaged if the solvent touches the dicing tape 105, the conventional stripping device requires an O-ring so as to supply the solvent to the supply plate 103 but not to the dicing tape 105 in dissolving the adhesive layer. The O-ring seals the boundary where the solvent supplying chamber and the support plate 103 contact with each other. Because of this, it takes a long time to supply the solvent to an edge portion at which the support plate 103 has no hole. As a result, the stripping of the support plate 103 from the wafer 102 takes a long time.

With the stripping device 110 according to the present embodiment, the retaining section 112 is configured such that the solvent will be retained on the support-plate-103-side surface and lateral surface of the laminate 101. As a result, the solvent permeates into the laminate 101 via a through hole of the support plate 103 and reaches the adhesive layer 104. Further, the solvent permeates into the laminate 101 from the lateral side of the laminate 101 so as to reach the adhesive layer 104. Thus, a sufficient amount of the solvent permeates to the adhesive layer 104 in the edge portion in which the support plate 103 has no hole. As a result, the adhesive layer 104 can be efficiently dissolved at the edge portion as well. This makes it possible to strip the support plate 103 from the wafer in a shorter time.

(Laminate 101)

The laminate 101 is so configured that the wafer 102 and the support plate 103 are adhered with each other via the adhesive layer 104. In the present embodiment, the support plate 103 is a holed support plate 103 having a plurality of through holes in a thickness direction thereof. The use of the holed support plate 103 makes it possible to supply the solvent to the adhesive layer 104 via the though holes. The wafer 102 of the laminate 101 may or may not have a circular shape and may have a non-circular shape partially having an orientation flat. The support plate 103 can have any shape that can support the wafer 102. However, it is preferable that the support plate 103 has a shape corresponding to that of the wafer 102.

(Adhesive Layer 104)

The adhesive layer 104 is formed from an adhesive compound soluble in a non-polar solvent or a highly polar solvent. Therefore, the adhesive layer 104 is soluble with the non-polar solvent or the highly polar solvent, thereby allowing stripping the support 103 from the wafer 102.

Examples of the adhesive compound soluble in a non-polar solvent encompass hydrocarbon resins. Examples of the hydrocarbon resin encompass, but not limited to, resins having a constituent unit derived from cycloolefin, terpene-based resins, and the like. Moreover, one non-limiting example of the resins having a constituent unit derived from cycloolefin is a cycloolefin-based polymer (hereinafter may be referred to as a "resin A").

The resin A is a resin prepared by polymerizing a monomer component including a cycloolefin-based monomer (a1). More specifically, the resin A may be a open-ring (co)polymer of the monomer component including the cycloolefin-based monomer (a1), a resin prepared by addition (co)polymerization of the monomer component including the cycloolefin-based monomer (a1), and the like polymer.

Examples of the cycloolefin-based monomer (a1) contained in the monomer component constituting the resin (A) encompass: two-ring compounds such as norbornene and norbornadiene; three-ring compounds such as dicyclopentadiene and dihydroxypentadiene; four-ring compounds such as tetracyclododecene; five-ring compounds such as cyclopentadiene trimer; seven-ring compounds such as tetracyclopentadiene; these polycyclic compounds substituted with an alkyl (methyl, ethyl, propyl, butyl, etc.) group, with an alkenyl (vinyl etc.) group, with an alkylidene (ethylidene etc.) group, or an aryl (phenyl, tolyl, naphthyl, etc.) group; and the like. Among these, the cycloolefin-based monomer (a1) may be preferably a norbornene-based monomer being represented by the following general formula (1), and being selected from the group consisting of norbornene and tetracyclododecene, which are substituted or not substituted with an alkyl group.

[Chem. 3]

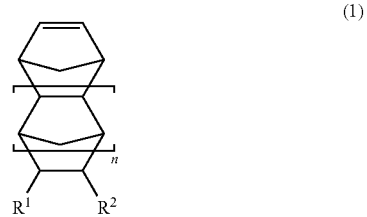

(1)

where $R_1$ and $R_2$ are independently a hydrogen or an alkyl group having 1 to 5 carbon atoms, and n is 0 or 1. The monomer components from which the resin A is produced may include, in addition to the cycloolefin-based monomer (a1), another monomer that is copolymerizable with the cycloolefin-based monomer (a1). Preferably, the another monomer may be, for example, an alkene monomer (a2) represented by the following general formula (2). Examples of the alkene monomer (a2) encompass ethylene, α-olefin, etc. The alkene monomer (a2) may be straight-chained or branched.

[Chem. 4]

(2)

where $R_3$ to $R_6$ are independently a hydrogen or an alkyl group having 1 to 5 carbon atoms. It is preferable that 50% or more by mass of the monomer component constituting the resin A is the cycloolefin-based monomer (a1). It is more preferable that 60% or more by mass of the monomer component constituting the resin A is the cycloolefin-based monomer (a1). When 50% or more by mass of the monomer component constituting the resin A is the cycloolefin-based monomer (a1), the adhesive layer 104 has a good adhesive strength under high-temperature environment.

In order to prevent gas generation under high temperature, it is preferable that the resin (A) is a resin not having a polar group. One example of the resin not having a polar group is a resin prepared by polymerizing monomer components comprising the cycloolefin-based monomer (a1) represented by Formula (1) and the alkene monomer (a2) represented by Formula (2).

There is no particular limitation as to a polymerization method, polymerization conditions, etc. for the polymerization of the monomer component. Thus, the polymerization of the monomer component may be carried out by standard methods known to the art.

Examples of commercially-available resin (A) encompass "TOPAS" (product name, made by Polyplastics Co., Ltd.), "APEL" (product name, made by Mitsui Chemicals Inc.), "ZEONOR" and "ZEONEX" (product names, made by Zeon Corp.), and "ARTON" (product name, made by JSR corp.), etc.

It is preferable that a glass transition point (Tg) of the resin (A) is 60° C. or higher. It is more preferable that the glass transition point (Tg) of the resin (A) is 70° C. or higher. If the glass transition point (Tg) of the resin (A) is 60° C. or higher, it is possible to prevent the adhesive layer from softening that may be caused when the adhesive composition is exposed to high-temperature environment.

The terpene-based resin (hereinafter, may be referred to as a "resin (B)" encompass a terpene resin, terpene phenol resin, modified terpene resin, hydrogenated terpene resin, and hydrogenated terpene phenol resin, and the like. Among these, hydrogenated terpene resin is preferable.

It is important that the softening point of the resin (B) be in a range of 80 to 160° C. If the softening point of the resin (B) is lower than 80° C., the adhesive layer will be softened when the adhesive composition is exposed to high-temperature environment. Meanwhile, if the softening point of the resin (B) is higher than 160° C., the stripping rate for stripping by ungluing the adhesive composition will be slow.

It is important that the resin (B) have a molecular weight of 300 to 3000. If the molecular weight of the resin (B) is less than 300, the adhesive layer will have insufficient heat tolerance, thereby causing gas generation under high-temperature environment. On the other hand, if the molecular weight of the resin (B) is greater than 3000, the stripping rate for stripping by ungluing the adhesive composition will be slow. In the present invention, the molecular weight of the resin (B) is a polystylene-based molecular weight measured by gel permeation chromatography (GPC).

The adhesive compound may include both or one of the resins (A) and (B). If the adhesive compound includes both of the resins (A) and (B), the resin (A) and the resin (B) are in such a ratio that (A):(B)=80:20 to 55:45 (by mass). If the resin (A) is contained more than the ratio (in other words, if the resin (B) is contained less than the ratio), the stripping ratio for stripping by ungluing the adhesive composition will be slow. On the other hand, if the resin (A) is contained less than the ratio (in other words, if the resin (B) is contained more than the ratio), the adhesive layer will be softened when the adhesive composition is exposed to high-temperature environment. The softening would cause adhesion failure.

Examples of the adhesive compound soluble in a highly polar solvent encompass, but not limited to, collagen peptide, cellulose, polyvinyl alcohol (PVA), starch, etc.

The collagen peptide can be generated by hydrolysis of a gelatin prepared by thermally denaturing collagen molecules in such a manner that helically-entangled polypeptide chains of the collagen molecules are partially detangled by thermal denaturing. The collagen molecules may be mammalian collagen molecules and fish collagen, preferably. The collagen molecules may be commercially available collagen molecules. The collagen molecules is preferably such that the collagen peptide prepared from the collagen molecule is dissolved into the polar solvent preferably at a dissolving rate of 100 to 300 nm/sec, and especially preferably of 200 nm/sec.

The adhesive layer 104 is formed from the adhesive compound soluble in the non-polar solvent or the highly polar solvent, and may be chosen as appropriate for treatment to which the laminate 101 is to be subjected. For example, if a large amount of water is to be used in a thinning process of the wafer 102, it is preferable to use an adhesive layer 104 formed from the adhesive compound soluble in the non-polar solvent, because an adhesive compound soluble in the highly polar solvent would possibly be dissolved in the water.

As to a layer thickness of the adhesive layer 104, the adhesive layer 104 should have a layer thickness that secures the adhesion between the wafer 102 and the support plate 103, and that provides the adhesive layer 104 with heat tolerance. The adhesive layer 104 may be formed by applying the adhesive compound on the wafer 102 or the support plate 103 and solidifying the adhesive compound to form a layer of the adhesive compound. As one alternative, a layer of the adhesive compound formed in advance by solidifying the adhesive compound may be applied to the wafer 102 or the support plate 103, so as to form the adhesive layer 104.

(Stripping Method)

A stripping method according the present embodiment of the second stripping method of the present invention is a stripping method for stripping the support plate 103 from the laminate 101 including the wafer 102 and the support plate 103 adhered to the wafer 102 via the adhesive layer 104, the method comprising: the step of supplying the solvent in such a manner that the solvent for dissolving the adhesive layer 104 is retained on the laminate 101; the step of vibrating, by using the vibrating section 117, at least the solvent retained on the laminate 101; and the step of moving the vibrating section 117 relatively to the laminate 101.

(Step of Supplying)

In the step of supplying, the solvent for dissolving the adhesive layer 104 is supplied to the laminate 101 to be treated with the stripping treatment, and the solvent is retained on the laminate 101. The solvent is preferably supplied to the laminate 101 in such a manner that the solvent covers the support-plate-103-side surface and lateral surface of the laminate 101 at least. In case where the stripping device 110 is used to strip the support plate 103 from the wafer 102, the solvent supplying chamber 111 is configured so that the retaining section 112 covers the laminate 101. With this configuration, the solvent supplied into the retaining section 112 is retained inside the retaining section 112, so that the support-plate-103-side surface and lateral surface of the laminate 101 are covered with the solvent, thereby soaking the laminate 101 in the solvent.

Here, the adhesive layer 104 is formed from the adhesive compound soluble in the non-polar solvent or the highly polar solvent. Thus, as the solvent for dissolving the adhesive layer 104, the non-polar solvent or the highly polar solvent is used in the step of supplying. That is, if the adhesive layer 104 is formed from the adhesive compound soluble in the non-polar solvent, the solvent used in the step of supplying is the non-polar solvent. If the adhesive layer 104 is formed from the adhesive compound soluble in the highly polar solvent, the solvent used in the step of supplying is the highly polar solvent.

The non-polar solvent may be suitably a non-polar solvent having a solubility parameter (SP value) of 8 or less. It is preferable that the non-polar solvent is a non-polar solvent having a SP value of 7.4 or less. Examples of such a non-polar solvent having a SP value of 7.4 or less encompass: hydrocarbon-based solvents such as terpene-based solvent (methane, limonene, pinene, etc.), toluene, xylene, n-hexane, isohexane, cyclohexane, methylcyclohexane, heptane, octance, nanone, etc.; fluorine-based solvents; and the like.

The highly polar solvent may be suitably a conventionally known polar solvent. It is preferable that the highly polar solvent is a polar solvent having a SP value of 10 or more. It is more preferable that the highly polar solvent is a polar solvent having a SP value of 12 or more. Examples of the polar solvent having a SP value of 12 or more encompass water, methanol, ethanol, isopropyl alcohol, etc.

Solubility of two types of dicing tapes (Tape A (polyolefin resin) and Tape B (vinyl chloride resin)) was evaluated with respect to difference in the polarity of the solvents. Each dicing tape was cut into cut samples of a size of 30 mm×50 mm and a pretreatment weight of each dicing tape was measured by using an electronic scale. Next, the cut samples of each dicing tape were respectively soaked for 10 minutes in solvents of a liquid temperature of 23° C. (normal temperature). The solvents used in the test were menthane (SP value=7.0), MAK (2 heptane; SP value=9.0), PGMEA (propylene glycol monomethyl ether acetate; SP value=9.2), ethanol (SP value=12.9), water (SP value=23.4). After the soaking in the solvents, the cut samples were dried for 30 minutes by using an oven that was set at 60° C. Then, a post-treatment weight of each cut sample was measured by using the electronic scale.

As a result, a weight change due to dissolution was observed in Tape A for MAK, PGMEA, and ethanol, while no weight change due to dissolution was observed in Tape A for menthane (the lowly polar solvent) and water (highly polar solvent). As to Tape B, a weight change due to dissolution was also observed in Tape B for MAK, PGMEA, and ethanol. Especially, it was observed that Tape B was dissolved quite significantly in MAK and PGMEA, which are polar solvents. Meanwhile, no weight change due to dissolution was observed in Tape B for menthane (the lowly polar solvent) and water (highly polar solvent) as well.

As demonstrated above, the use of the non-polar solvent or the highly polar solvent for dissolving the adhesive layer 104 in the step of supplying prevents the dicing tape 105 from being damaged by the solvent that may touch the dicing tape. The adhesive layer of the dicing tape 105 is generally formed from acrylic adhesive agent, and thus is tolerant against the non-polar solvent and the highly polar solvent. Therefore, when supplying the solvent so as to cover the support-plate surface and the lateral surface of the laminate 101 with the solvent, it is not necessary to worry about the consequences of the solvent touching the solvent touches the dicing tape 105.

In the conventional stripping method, the solvent would damage the dicing tape 105 when the solvent touches the dicing tape 105. To avoid this problem, the dissolving the adhesive layer in the conventional stripping method should be arranged such that the solvent is supplied to the support plate 103 but not to the dicing tape 105 so that the solvent does not touch the dicing tape 105. Due to this, it takes a long time to supply the solvent especially to the edge portion of the support plate 103 in which edge portion no hole is provided. As a result, the stripping the support plate 103 to the wafer 102 takes a long time.

According to the stripping method of the present embodiment, the solvent is supplied, so that the solvent is retained on the support-plate-103-side surface and lateral surface of the laminate 101. The solvent permeates into the laminate 101 through the though holes of the support plate 103 so as to reach the adhesive layer 104. Further, the solvent reaches the adhesive layer 104 from the lateral side of the laminate 101. Therefore, the solvent sufficiently permeates to the adhesive layer 104 at the edge portion at which the support plate 103 has no hole. Thereby, the adhesive layer 104 can be dissolved efficiently. As a result, it is possible to strip the support plate 103 from the wafer 102 in a shorter time. In order to facilitate the solvent to permeate into and to dissolve the adhesive layer 104, a temperature of the solvent to be supplied may be adjusted as appropriate.

(Step of Vibrating)

In the step of vibrating, at least the solvent supplied and retained on the laminate 101 in the step of supplying is vibrated by the vibrating section 117. In case where the stripping device 110 is used to strip the support plate 103 from wafer 102, the vibration caused by the vibrating section 117 can be transferred to the solvent by providing the vibrating section 117 on the vibration transferring section 116 of the solvent supplying chamber 111, the solvent being retained on the laminate 101 and the solvent supplying chamber 111 covering the laminate 101 with the retaining section 112. The step of vibrating may be carried out after the step of supplying supplies the solvent to the laminate 101, or concurrently while the step of supplying supplies the solvent to the laminate 101.

(Step of Moving)

In the step of moving, the vibrating section 117 is moved relatively to the laminate 101. It is preferable that the step of moving moves the vibrating section 117 along a periphery of the laminate 101. In case where the stripping device 110 is used to strip the support plate 103 from the wafer 102, the rotation of the solvent supplying chamber 111 along the periphery of the laminate 101 can move the vibrating section 117 on the vibration transmitting section 116 of the solvent supplying chamber 111 relatively to the laminate 101.

The step of moving may be carried out concurrently with the step of vibrating in which the vibrating section 117 performs the vibration. As one alternative, the step of moving and the step of vibrating may be carried out alternatively, for example, in such a manner that, after the step of vibrating is stopped, the step of moving is carried out, and then after the step of moving, the step of vibrating is resumed. Moreover, it may be so arranged that the step of moving is carried out after the solvent is supplied by the step of supplying, the vibration is caused by the step of vibrating, and then the solvent thus supplied is collected. In this case, after the solvent thus supplied is collected, the solvent supplying chamber 111 is lifted up and rotated by the rotating section 118, and then the solvent supplying chamber 111 is lifted down until the solvent supplying chamber 111 touches the dicing tape 105. Then, the step of supplying supplies to solvent to the retaining section 112 again and the step of vibrating is resumed.

(Step of Collecting and Step of Washing)

In the stripping method according to the present embodiment, the solvent supplied in the step of supplying is collected (step of collecting) after the solvent is retained on the laminate 101. In the step of collecting, the solvent is collected from the lateral side of the laminate 101. After the solvent is collected in the step of collecting, and the adhesive layer 104 is dissolved, the support plate 103 is stripped from the wafer 102. It may be arranged such that after the support plate 103 is stripped from the wafer 102, the non-polar solvent or the highly polar solvent is supplied on the wafer 102 so as to wash the wafer 102 with the non-polar solvent or the highly polar solvent (step of washing). The washing removes the adhesive layer 104 residual on the wafer 102.

One specific example of the stripping method according to the present embodiment is explained below referring to (a) to (f) of FIG. 6, which are views schematically illustrating the stripping method according to the present embodiment of the second stripping method of the present invention. The present embodiment is explained based on an example in which the boundary between the solvent supplying chamber 111 and the dicing tape 105 are sealed with the O ring 113.

Figure 6:
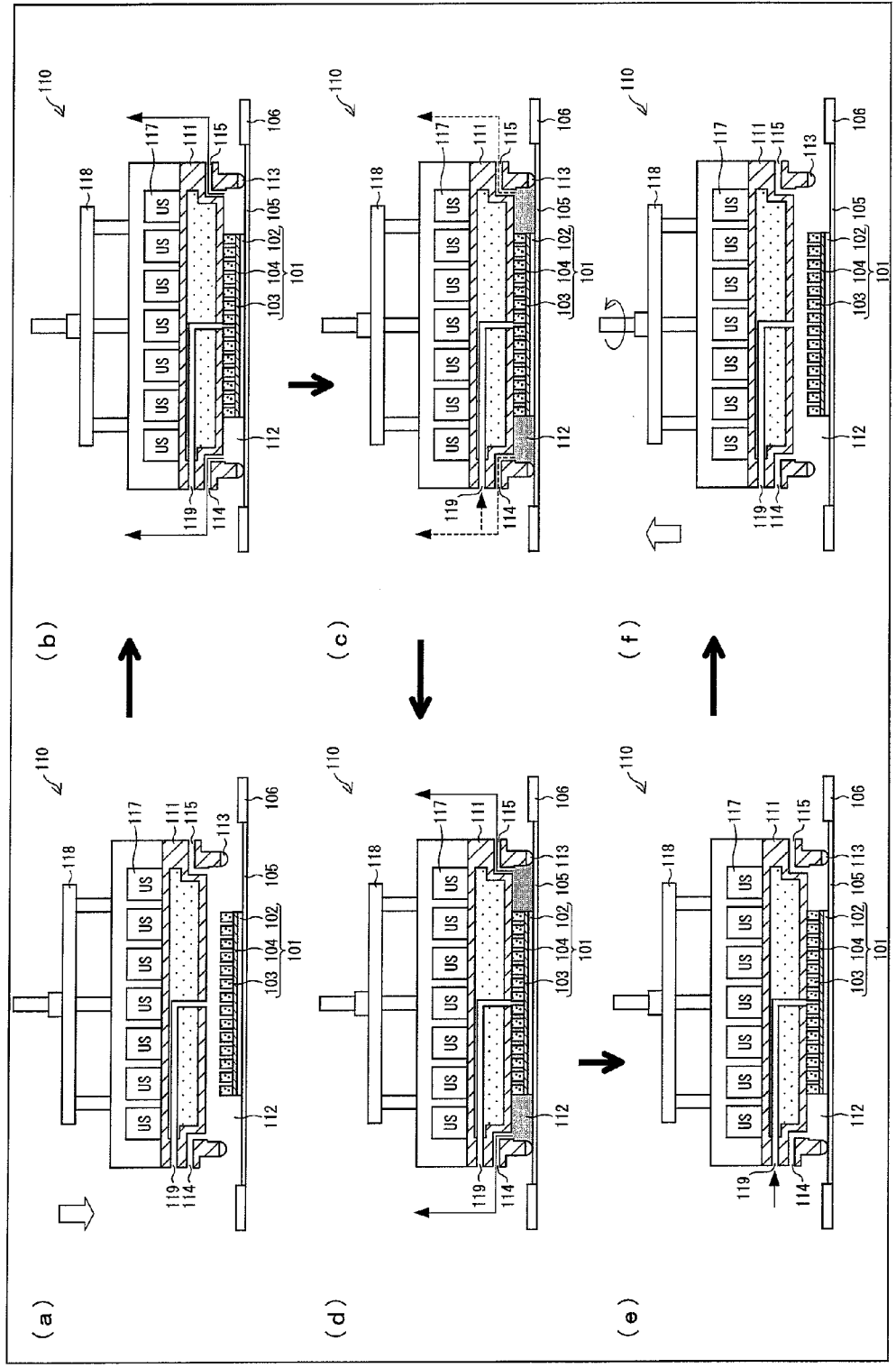
FIGS. 6(a)-(f) are views schematically illustrating a stripping method according to one embodiment (third embodiment) of the second stripping method of the present invention.

To begin with, as illustrated in (a) of FIG. 6, the solvent supplying chamber 111 is moved above the laminate 101 and lowered until the O ring 113 touches the dicing tape 105. The O ring 113 has an outer diameter greater than the outer diameter of the laminate 101. Thus, the solvent supplying chamber 111 is placed over the laminate 101 such that the solvent supplying chamber 111 covers the laminate 101.

Next, as illustrated in (b) of FIG. 6, an air inside the retaining section formed between the solvent supplying chamber 111 and the dicing tape 105 is sucked out from the discharging openings 114 and 115, so as to lower pressure inside the retaining section 112. Then, as illustrated in (c) of FIG. 6, the solvent is supplied into the retaining section 112 via the center supplying opening 119. The solvent is supplied into the retaining section 112 via the center supplying opening 119, while the solvent is sucked via the discharging openings 114 and 115. Thereby, the solvent is retained inside the retaining section 112. In this example, the solvent into the retaining section 112 is supplied by initial supply of 60 sec. Then, 5 to 20-min vibrating treatment is carried out by using a vibrating section 117.

As illustrated in (d) of FIG. 6, the solvent inside the retaining section 112 is sucked out via the discharging openings 114 and 115, so as to discharge the solvent out of the retaining section 112. Then, as illustrated in (e) of FIG. 6, the lowering the pressure inside the retaining section 112 is stopped and an air is introduced into the retaining section 112 via the central supplying opening 119 (releasing the pressure to atmosphere), thereby bringing the pressure in the retaining section 112 to the atmospheric pressure. Then, as illustrated in (f) of FIG. 6, the solvent supplying chamber 111 is lifted up and rotated about the laminate 101. It may be arranged such that the processes illustrated in (a) to (f) of FIG. 6 are repeated a predetermined number of times. Through these processes, the solvent supplied on the laminate 101 uniformly permeates into the adhesive layer 104. Therefore, the adhesive layer 104 can be dissolved in a shorter time. As a result, it becomes possible to strip the support plate 103 from the wafer 102 in a shorter time.

Fourth Embodiment (Stripping Device 120)

Figure 7:
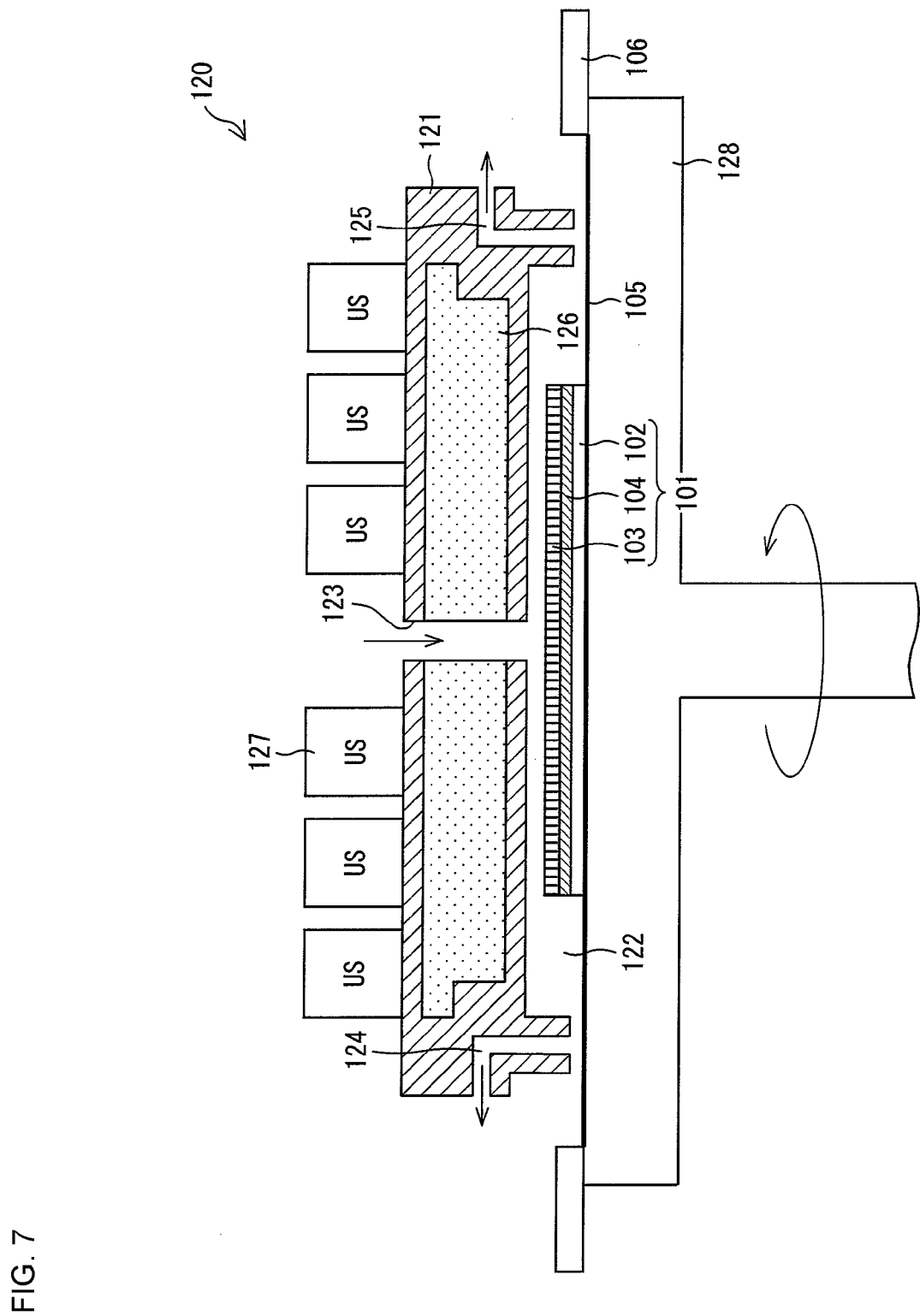
FIG. 7 is a cross sectional view schematically illustrating to a stripping device according to yet another embodiment (fourth embodiment) of the second stripping device of the present invention.

A stripping device according to another embodiment of the second stripping method and second stripping device of the present invention is described below referring to FIG. 7, which is a cross sectional view schematically illustrating a striping device 120 according to the another embodiment of the second stripping device of the present invention. As illustrated in FIG. 7, the stripping device 120 includes a solvent supplying chamber 121. The solvent supplying chamber 121 forms a retaining section 122 between the solvent supplying chamber 121 and the dicing tape 105 when the solvent supplying chamber 121 touches the dicing tape 105. The retaining section 122 is configured to retain the solvent therein.

The solvent supplying chamber 121 is configured such that the solvent supplying chamber 121 contains the laminate 101 inside thereof, that is, within the retaining section 122. The retaining section 122 is constituted by a space formed between the solvent supplying chamber 121 and the dicing tape 105 when the solvent supplying chamber 121 touches the dicing tape 105. The solvent supplying chamber 121 has, at a center portion thereof, a supplying opening 123 for supplying the solvent into the retaining section 122. Moreover, the solvent supplying chamber 121 has discharging openings 124 and 125, which are through holes opened on a contact surface of the solvent supplying chamber 121 and opened on a lateral side of the solvent supplying chamber 121. The contact surface of the solvent supplying chamber 121 is a surface with which the solvent supplying chamber 121 touches the dicing tape 105. A surface tension of the solvent at the boundary between the solvent supplying chamber 121 and the dicing tape 105 at which boundary they touch each other causes the solvent to be held inside the retaining section 122, thereby preventing the solvent from leaking out of the retaining section 122.

The stripping device 120 includes a vibration transmitting section 126 for transmitting vibration to the solvent retained inside the retaining section 122, the vibration being caused by a vibrating section 127 provided on the solvent supplying chamber 121. The vibration transmitting section 126 and the vibrating section 127 are similar to the vibration transmitting section 116 and the vibrating section 117 in the third embodiment. Therefore, their explanation is omitted here.

In the stripping device 120, the laminate 101 is held on a holding station of the rotating section 128 in such a way that the surface of the laminate 101 which surface is adhered with the dicing tape 105 touches the holding station of the rotating section 128. The rotating section 128 rotates the dicing tape 105 with the dicing tape adhered to the laminate 101 fixed by chucking mechanism (not illustrated). By this, the laminate 10 adhered with the dicing tape 105 is moved relatively to the vibrating section 127 on the vibration transmitting section 126 of the solvent supplying chamber 121. This causes uniform transmission of the vibration from the vibrating section 127 through the solvent inside the retaining section 22, whereby the solvent supplied on the laminate 101 uniformly permeates into the adhesive layer 104. Therefore, the adhesive layer 104 can be dissolved in a shorter time. As a result, it becomes possible to strip the support plate 103 from the wafer 102 in a shorter time.

The surface tension at the boundary where the supplying chamber 121 and the dicing tape 105 contact with each other keeps the solvent within the retaining section 122. The surface tension prevents the solvent from leaking out of the retaining section 122 even during the rotation of the dicing tape 105 by the rotating section 128. Thus, the stripping device 120 can carry out the supply of the solvent to the retaining section 122, the vibration of the vibrating section 127, and the rotation of the dicing tape by the rotating section 128, concurrently.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

Industrial Applicability

According to a stripping method and a stripping device of the present invention, it is possible to strip a support plate from a wafer in a shorter time. For example, the stripping method and the stripping device of the present invention are suitably applicable to manufacture of a semiconductor device to be miniaturized.

| Reference Signs List | |
|---|---|
| 1, 101: | Laminate |
| 2, 102: | Wafer (Substrate) |
| 3, 103: | Support Plate |
| 4, 104: | Adhesive Layer |
| 5, 105: | Dicing Tape |
| 6, 106: | Dicing Frame |
| 10, 110: | Stripping Device |
| 11, 111: | Solvent Supplying Chamber (Retaining Means) |
| 12, 112: | Retaining Section |
| 13, 113: | O ring |
| 14: | Supplying Opening |
| 15: | Discharge Opening |
| 16: | Discharge Opening |
| 114: | Discharge Opening (Collecting Opening) |
| 115: | Discharge Opening (Collecting Opening) |
| 116: | Vibration Transmitting Section |
| 117: | Vibrating Section |
| 118: | Rotating Section (Moving Means) |
| 119: | Central Supplying Opening (Supplying Opening) |

What is claimed is:

1. A stripping method for stripping a support plate from a laminate including a substrate and the support plate adhered to the substrate via an adhesive layer, the stripping method comprising:
    supplying on the laminate a solvent to dissolve the adhesive layer, so that the solvent is retained on the laminate;
    vibrating, by a vibrating section, at least the solvent retained on the laminate;
    transmitting, by a vibration transmitting section provided between a retaining means and the vibrating section, the vibration from the at least one vibrating section to the solvent retained on the laminate; and
    collecting the solvent retained on the laminate,
    wherein the vibration transmitting section has a supplying opening and a collecting opening, the supplying opening supplies the solvent to the retaining means via the supplying opening, and the collecting opening collects the solvent on the laminate via the collecting opening.

2. The stripping method as set forth in claim 1, further comprising moving the vibrating section relative to the laminate, wherein the vibrating and the moving are carried out concurrently.

3. The stripping method as set forth in claim 1, further comprising moving the vibrating section relative to the laminate, wherein the vibrating and the moving are not carried out concurrently.

* * * * *